(12) United States Patent
Park et al.

(10) Patent No.: US 8,525,231 B2
(45) Date of Patent: Sep. 3, 2013

(54) SEMICONDUCTOR DEVICE AND METHOD OF MANUFACTURING THE SAME

(75) Inventors: Ki Yeol Park, Suwon (KR); Woo Chul Jeon, Suwon (KR); Young Hwan Park, Seoul (KR); Jung Hee Lee, Daegu (KR)

(73) Assignee: Samsung Electro-Mechanics Co., Ltd., Suwon, Gyunggi-do (KR)

( * ) Notice: Subject to any disclaimer, the term of this patent is extended or adjusted under 35 U.S.C. 154(b) by 487 days.

(21) Appl. No.: 12/965,649

(22) Filed: Dec. 10, 2010

(65) Prior Publication Data

US 2011/0233623 A1    Sep. 29, 2011

(30) Foreign Application Priority Data

Mar. 26, 2010   (KR) .................. 10-2010-0027392

(51) Int. Cl.
*H01L 29/66*   (2006.01)

(52) U.S. Cl.
USPC ............... 257/194; 257/288; 257/E29.246; 257/E29.25; 257/E29.251; 438/167; 438/172

(58) Field of Classification Search
USPC ......... 257/192, 194, 288, E29.246, E29.249, 257/E29.25, E29.251, E29.253, E21.403, 257/E21.407; 438/167, 172, 290
See application file for complete search history.

(56) References Cited

U.S. PATENT DOCUMENTS

| | | | |
|---|---|---|---|
| 4,780,748 A | 10/1988 | Cunningham et al. | |
| 7,339,208 B2 | 3/2008 | Brar et al. | |

FOREIGN PATENT DOCUMENTS

KR   10-2007-0024647    3/2007

*Primary Examiner* — Matthew Landau
*Assistant Examiner* — Colleen E Snow
(74) *Attorney, Agent, or Firm* — McDermott Will & Emery LLP (57) ABSTRACT

There is provided a semiconductor device and a method of manufacturing the same. The semiconductor device includes a base substrate; a semiconductor layer having a receiving groove, a protrusion part, a first carrier injection layer, at least two insulating patterns, and a second carrier injection layer provided on the base substrate, the insulating patterns being disposed to traverse the first carrier injection layer and the second carrier injection layer being spaced apart from the first carrier injection layer and disposed on a lower portion of the protrusion part; a source electrode and a drain electrode disposed to be spaced apart from each other on the semiconductor layer; and a gate electrode insulated from the source electrode and the drain electrode and having a recess part recessed into the receiving groove, wherein a lowest portion of the receiving groove contacts an uppermost layer of the first carrier injection layer or is disposed above the uppermost layer thereof, and an insulating pattern, disposed at an innermost portion of the semiconductor layer among the insulating patterns, traverses the first carrier injection layer and is disposed at the outside of both sides of the receiving groove in a thickness direction thereof.

30 Claims, 7 Drawing Sheets

SEMICONDUCTOR DEVICE AND METHOD OF MANUFACTURING THE SAME

CROSS-REFERENCE TO RELATED APPLICATIONS

This application claims the priority of Korean Patent Application No. 10-2010-0027392 filed on Mar. 26, 2010, in the Korean Intellectual Property Office, the disclosure of which is incorporated herein by reference.

BACKGROUND OF THE INVENTION

1. Field of the Invention

The present invention relates to a semiconductor device, and more particularly, to a semiconductor device having a nitride-based semiconductor field effect transistor structure and a method of manufacturing the same.

2. Description of the Related Art

In general, a group III-nitride-based semiconductor including group III elements such as gallium (Ga), aluminum (Al), indium (In), or the like, and nitrogen (N), has characteristics such as a wide energy band gap, high electron mobility, high saturation electron speed, high thermochemical stability, and the like.

A nitride-based field effect transistor (N-FET) based on the group III-nitride-based semiconductor is manufactured using a semiconductor material having a wide energy band gap, for example, gallium nitride (GaN), aluminum gallium nitride (AlGaN), indium gallium nitride (InGaN), aluminum indium gallium nitride (AlINGaN), or the like.

A semiconductor device having a general N-FET includes a base substrate, a nitride-based semiconductor layer formed on the base substrate, and a source electrode and a drain electrode formed on the semiconductor layer, and a gate electrode formed on the semiconductor layer between the source electrode and the drain electrode.

However, a field effect transistor using gallium nitride (GaN) is continually in a 'turned-on' state in which current flows due to low resistance between a drain electrode and a source electrode when gate voltage is 0V (normal state), such that it consumes current and power. For turning-off the field effect transistor, there is a disadvantage in that negative voltage should be applied to a gate electrode (normally-on structure).

SUMMARY OF THE INVENTION

An aspect of the present invention provides a semiconductor device having a field effect transistor (FET) structure allowing for enhanced performance and a method of manufacturing the same.

An aspect of the present invention also provides a semiconductor device of an FET structure allowing for high-current and high-output operations and a method of manufacturing the same.

According to an aspect of the present invention, there is provided a semiconductor device including: a base substrate; a semiconductor layer having a receiving groove, a protrusion part, a first carrier injection layer, at least two insulating patterns, and a second carrier injection layer provided on the base substrate, the insulating patterns being disposed to traverse the first carrier injection layer and the second carrier injection layer being spaced apart from the first carrier injection layer and disposed on a lower portion of the protrusion part; a source electrode and a drain electrode disposed to be spaced apart from each other on the semiconductor layer; and a gate electrode insulated from the source electrode and the drain electrode and having a recess part recessed into the receiving groove, wherein a lowest portion of the receiving groove contacts an uppermost layer of the first carrier injection layer or is disposed above the uppermost layer thereof, and an insulating pattern, disposed at an innermost portion of the semiconductor layer among the insulating patterns, traverses the first carrier injection layer and is disposed at the outside of both sides of the receiving groove in a thickness direction thereof.

The lowest portion of the receiving groove may contact a lowest layer of the second carrier injection layer or be disposed below the lowest layer thereof.

The first carrier injection layer may be a high-concentration doping layer.

The high-concentration doping layer may be a delta doping layer.

The delta doping layer may be provided by being doped with at least any one selected from Si, Ge, and Sn.

The second carrier injection layer may be a high-concentration doping layer.

The high-concentration doping layer may be a delta doping layer.

The delta doping layer may be provided by being doped with at least any one selected from Si, Ge, and Sn.

The second carrier injection layer may be a 2-dimensional electron gas layer.

The insulating patterns may include three or more insulating patterns.

The insulating patterns may be spaced apart from each other by a predetermined interval.

The receiving groove may have both sides inclined relative to the lowest portion at an angle ranging from 30° to 90°.

The semiconductor device may further include an oxide layer interposed between the receiving groove and the recess part.

The oxide layer may have a recess structure corresponding to a shape of the recess part.

The semiconductor device may further include a buffer layer between the base substrate and the semiconductor layer.

According another aspect of the present invention, there is provided a method of manufacturing a semiconductor device, the method including: preparing a base substrate; forming a semiconductor layer having a receiving groove, a protrusion part, a first carrier injection layer, at least two insulating patterns and a second carrier injection layer provided on the base substrate, the insulating patterns being disposed to traverse the first carrier injection layer and the second carrier injection layer being spaced apart from the first carrier injection layer and disposed on a lower portion of the protrusion part; forming a source electrode and a drain electrode to be spaced apart from each other on the semiconductor layer; and forming a gate electrode on the semiconductor layer, the gate electrode being insulated from the source electrode and the drain electrode and having a recess part recessed into the receiving groove, wherein a lowest portion of the receiving groove contacts an uppermost layer of the first carrier injection layer or is disposed above the uppermost layer thereof, and an insulating pattern, disposed at an innermost portion of the semiconductor layer among the insulating patterns, traverses the first carrier injection layer and is disposed at the outside of both sides of the receiving groove in a thickness direction thereof.

The lowest portion of the receiving groove may contact a lowest layer of the second carrier injection layer or be disposed below the lowest layer thereof.

The first carrier injection layer may be a high-concentration doping layer.

The high-concentration doping layer may be a delta doping layer.

The delta doping layer may be formed by being doped with at least any one selected from Si, Ge, and Sn.

The second carrier injection layer may be a high-concentration doping layer.

The high-concentration doping layer may be a delta doping layer.

The delta doping layer may be formed by being doped with at least any one selected from Si, Ge, and Sn.

The second carrier injection layer may be a 2-dimensional electron gas layer.

The insulating patterns may include three or more insulating patterns.

The insulating patterns may be spaced apart from each other by a predetermined interval.

The receiving groove may be formed such that both sides thereof are inclined relative to the lowest portion at an angle ranging from 30° to 90°.

The method may further include forming an oxide layer to be interposed between the receiving groove and the recess part.

The oxide layer may have a recess structure corresponding to a shape of the recess part.

The method may further include forming a buffer layer on the base substrate prior to the forming of the semiconductor layer.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Various advantages and features of the present invention and a method thereof will become apparent from the following description of exemplary embodiments with reference to the accompanying drawings. However, the present invention may be modified in many different manners and should not be construed as being limited to the exemplary embodiments set forth herein. Rather, these exemplary embodiments may be provided so that this disclosure will be thorough and complete, and will fully convey the scope of the invention to those having skill in the art. Throughout the drawings, the same reference numerals will be used to designate the same or like elements.

Terms used in the present specification are used so as to explain the exemplary embodiments rather than limiting the present invention thereto. Unless explicitly described to the contrary, a singular form includes a plural form in the present specification. The word "include" and variations such as "includes" or "including," will be understood to imply the inclusion of stated constituents, steps, operations and/or elements but not the exclusion of any other constituents, steps, operations and/or elements.

Further, the exemplary embodiments described in the specification will be described with reference to cross-sectional views and/or plan views that are ideal exemplification figures. In the drawings, the thickness of layers and regions may be exaggerated for efficient description of technical contents and consequently, exemplified forms may be changed by manufacturing technologies and/or tolerances. Therefore, the exemplary embodiments of the present invention are not limited to specific forms but may include a change in forms generated according to the manufacturing processes. For example, an etching region shown vertically may be rounded or may have a predetermined curvature. Therefore, the regions shown in the drawings have schematic attributes and the shapes shown in the drawings show specific shapes of device regions by way of example only, but are not limited to the scope of the invention.

Hereinafter, a semiconductor device and a method of manufacturing the same according to exemplary embodiments of the present invention will be described with reference to the accompanying drawings.

Figure 1:
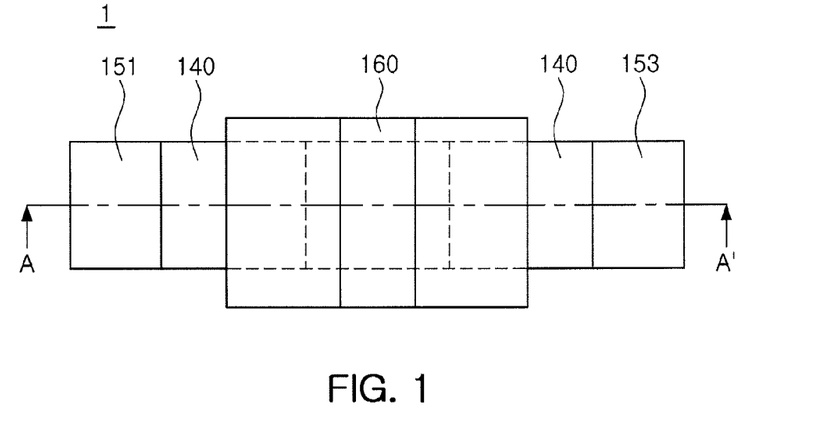
FIG. 1 is a schematic plan view illustrating a semiconductor device according to a first exemplary embodiment of the present invention.
Figure 2:
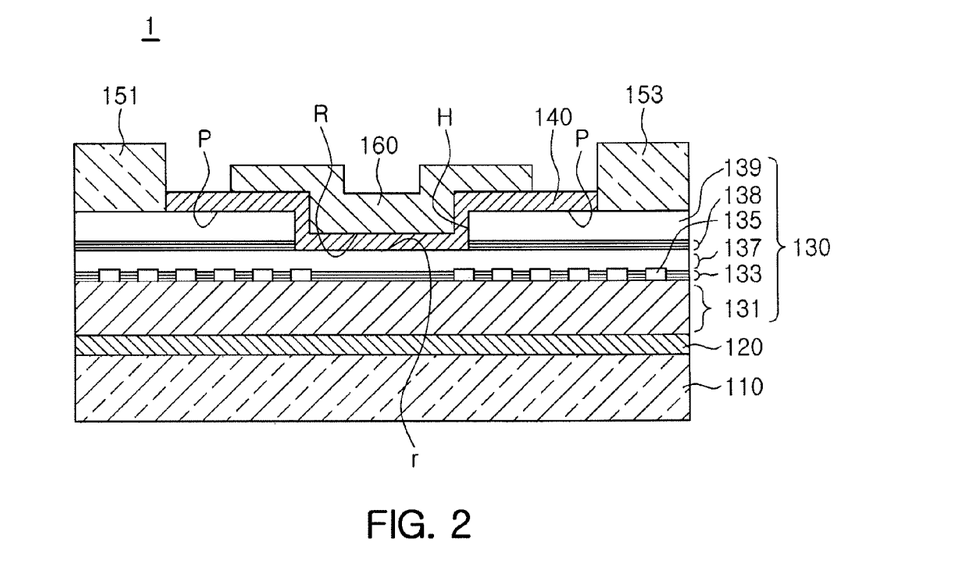
FIG. 2 is a cross-sectional view taken along line A-A' of FIG. 1.
Figure 3:
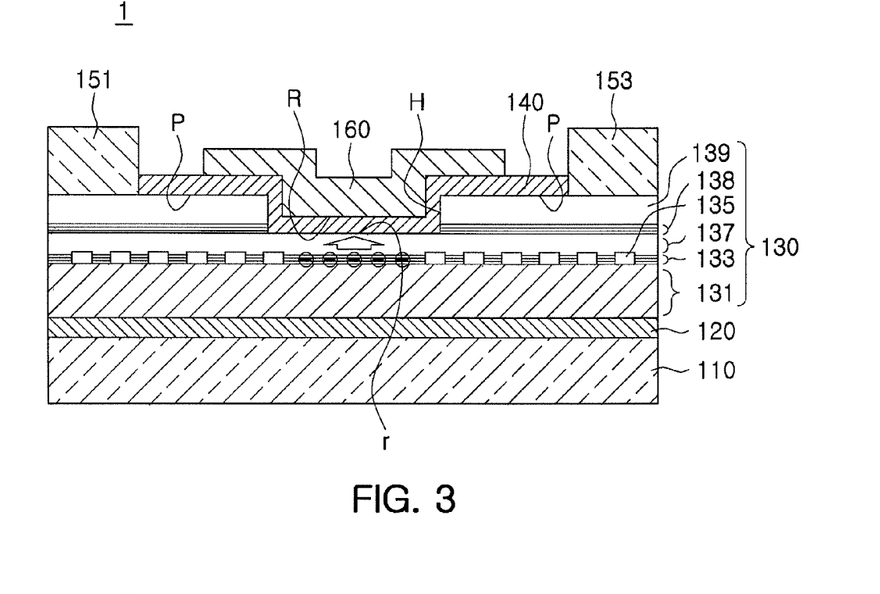
FIG. 3 is a schematic cross-sectional view illustrating an operational principle of the semiconductor device according to the first exemplary embodiment of the present invention.

FIG. 1 is a schematic plan view illustrating a semiconductor device according to a first exemplary embodiment of the present invention. FIG. 2 is a cross-sectional view taken along line A-A' of FIG. 1. FIG. 3 is a schematic cross-sectional view illustrating an operational principle of the semiconductor device according to the first exemplary embodiment of the present invention.

Referring to FIGS. 1 and 2, a semiconductor device 1 according to an exemplary embodiment of the invention may include a base substrate 110, a buffer layer 120, a semiconductor layer 130, a source electrode 151, a drain electrode 153, and a gate electrode 160.

The base substrate 110 may be a plate for forming a semiconductor device having a field effect transistor (FET) structure. For example, the base substrate 110 may be a semiconductor substrate. As an example, the base substrate 110 may be any one of a silicon substrate, a silicon carbide substrate, and a sapphire substrate; however, the base substrate 110 is not limited thereto.

Next, the buffer layer 120 may be disposed on the base substrate 110. As an example, the buffer layer 120 may be formed of an aluminum nitride (AlN) layer; however, the buffer layer 120 is not limited thereto. Herein, the buffer layer 120 may be provided to solve the problems caused due to a lattice mismatch between the base substrate 110 and a lower layer 131 of the semiconductor layer 130 to be subsequently formed.

The semiconductor layer 130 may be disposed on the buffer layer 120. As an example, the semiconductor layer 130 includes a receiving groove H and a protrusion part P. Further, the semiconductor layer 130 includes the lower layer 131, a first carrier injection layer 133, at least two insulating patterns 135, an intermediate layer 137, a second carrier injection layer 138 and an upper layer 139, which are sequentially stacked therein. The insulating patterns 135 are provided to traverse the first carrier injection layer 133. The second carrier injection layer 138, spaced apart from the first carrier injection layer 133, and the upper layer 139 are included in the protrusion part P.

The upper layer 139 may be formed of a material having a lattice constant different from the lower layer 131 and the intermediate layer 137. Like this embodiment, the lower layer 131 and the intermediate layer 137 may be gallium nitride (GaN) layers and the upper layer 139 may be an $n^+$ gallium nitride ($n^+$-GaN) layer.

In the semiconductor layer 130 having the above-described structure, a high-concentration doping layer may be provided as the first carrier injection layer 133 at the interface between the lower layer 131 and the intermediate layer 137 or the second carrier injection layer 138 at the interface between the intermediate layer 137 and the upper layer 139. When the semiconductor device 1 is operated, current may flow through carriers supplied by the high-concentration doping layer.

The first carrier injection layer 133 and the second carrier injection layer 138 may be formed by alternately aligning a multi-layered gallium nitride (GaN) layer and a doping material in a thickness direction. Herein, the insulating patterns 135 are disposed to traverse the first carrier injection layer 133. The first carrier injection layer 133 and the second carrier injection layer 138 may be formed by being doped with at least any one selected from Si, Ge, and Sn, preferably doped with Si. However, doping elements of the first carrier injection layer 133 and the second carrier injection layer 138 are not limited thereto. Herein, the first carrier injection layer 133 or the second carrier injection layer 138 employs a high-concentration doping layer, especially a delta doping layer as an example, but is not limited thereto.

The upper layer 139 may be disposed on the second carrier injection layer 138. Herein, the upper layer 139 may be formed of an $n^+$ gallium nitride ($n^+$-GaN) layer.

Meanwhile, the receiving groove H may be included in the semiconductor layer 130. The receiving groove H may be formed through a predetermined photoresist process.

An oxide layer 140 may be provided on the receiving groove H. The oxide layer 140 is further formed through a predetermined photoresist process and includes a recess structure r corresponding to the shape of the receiving groove H. The oxide layer 140 may be a layer made of silicon dioxide ($SiO_2$). The exemplary embodiment may describe, by way of example, the case in which the oxide layer 140 is an oxide layer, but the oxide layer 140 may include a nitride layer. The lowest portion of the receiving groove H may contact the uppermost layer of the first carrier injection layer 133 or be disposed above the uppermost layer of the first carrier injection layer 133. Also, the lowest portion of the receiving groove H may contact the lowest layer of the second carrier injection layer 138 or be disposed below the lowest layer of the second carrier injection layer 138.

The insulating pattern 135, disposed at the innermost portion of the semiconductor layer 130, may traverse the first carrier injection layer 133 and be disposed at the outside of both sides of the receiving groove H in the thickness direction thereof.

The gate electrode 160 is provided on the oxide layer 140. The gate electrode 160 includes a recess part R received in a recess structure r of the oxide layer 140. The gate electrode 160 may directly contact the oxide layer 140, thereby forming a Schottky electrode.

The source electrode 151 and the drain electrode 153 may be disposed to be spaced apart from each other, having the gate electrode 160 therebetween. The source electrode 151 and the drain electrode 153 junction the upper layer 139 of the semiconductor layer 130, such that they may make ohmic-contact with the upper layer 139.

Meanwhile, the source electrode 151, the drain electrode 153, and the gate electrode 160 may be formed of various materials. As an example, the source electrode 151 and the drain electrode 153 may be formed of the same metal material and the gate electrode 160 may be formed of a metal material different from that of the source electrode 151. In this case, the source electrode 151 and the drain electrode 153 are formed of titanium (Ti), aluminum (Al), nickel (Ni), and gold (Au) from the lower portions thereof, wherein the titanium (Ti) and the aluminum (Al) of the lower portions may junction any one selected from gallium nitride (GaN), $n^+$ gallium nitride ($n^+$-GaN), aluminum gallium nitride (AlGaN), indium gallium nitride (InGaN), and indium aluminum gallium nitride (InAlGaN) that form the upper layer 139 and the protrusion part P, whereby the ohmic contact may be achieved. The gate electrode 160 may be formed of a metal material including metal elements different from at least any one of the above-mentioned metal elements. As another example, all of the source electrode 151, drain electrode 153, and gate electrode 160 may be formed of the same metal material. To this end, the source electrode 151, the drain electrode 153, and the gate electrode 160 may be simultaneously formed by forming the same metal layer on the semiconductor layer 130 and then being subjected to the same photoresist etching process.

Referring to FIG. 3, the semiconductor device 1 provides the oxide layer 140 between the gate electrode 160 and the semiconductor layer 130 to form a normally-off state in which there is no current flow even though voltage is applied to the source electrode 151 and the drain electrode 153, when voltage is not applied to the gate electrode 160. Therefore, the semiconductor device 1 may have an FET structure capable of performing an enhancement mode operation, which prevents current from flowing when the gate voltage is 0 or negative (−).

In addition, the semiconductor device 1 having the FET structure includes the first carrier injection layer 133 formed of a delta doping layer, which is a high-concentration doping layer, below the gate electrode 160, so that it has an increase in the concentration of carriers at the time of forming a channel, thereby having an increase in current density as compared with a conventional transistor. Also, the insulating patterns 135 are inserted into the high-concentration doping layer such that the generation of a parasitic channel is prevented. Since the generation of the parasitic channel is prevented, current control is facilitated. This allows the semiconductor device 1 having the FET structure to operate at high current and in a normally-off state.

As described above, the semiconductor device 1 having the FET structure includes the first carrier injection layer 133 formed of the delta doping layer, which is the high-concentration doping layer, below the gate electrode 160 and the second carrier injection layer 138 at the interface between the intermediate layer 137 and the upper layer 139, so that it has an increase in the concentration of carriers at the time of forming a channel, thereby having an increase in current density as compared with a conventional transistor. Furthermore, the insulating patterns 135 are inserted into the high-concentration doping layer such that the generation of a parasitic channel is prevented. Since the generation of the parasitic channel is prevented, current control is facilitated. This allows the semiconductor device 1 having the FET structure to operate at high current and in a normally-off state.

Hereinafter, with reference to FIGS. 4 through 6, a semiconductor device according to second to fourth exemplary embodiments of the present invention will be briefly described based on elements different from the first exemplary embodiment.

Figure 4:
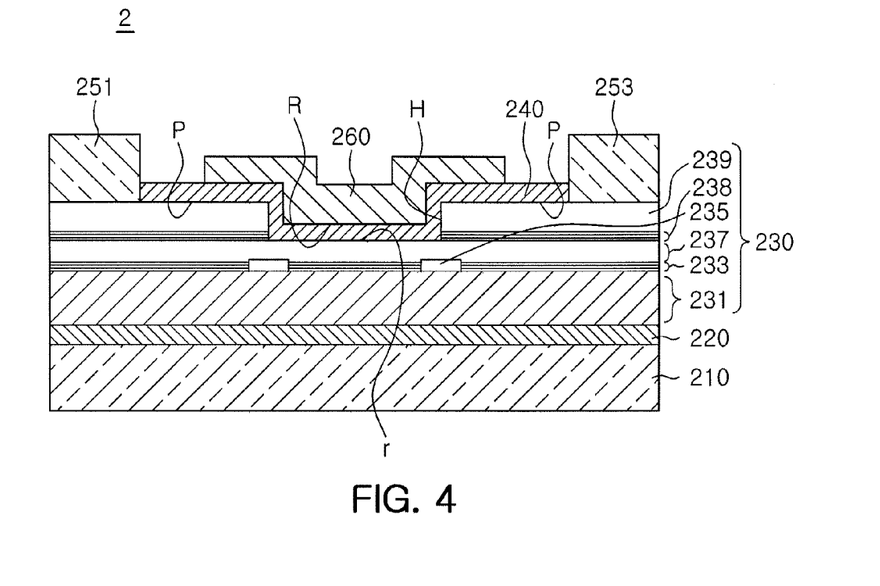
FIG. 4 is a schematic cross-sectional view illustrating a semiconductor device according to a second exemplary embodiment of the present invention.

Referring to FIG. 4, a semiconductor device 2 according to a second exemplary embodiment of the invention has a difference in the structure of an insulating pattern with respect to the semiconductor device 1 according to the first exemplary embodiment.

Insulating patterns 235 according to the second exemplary embodiment of the invention are also disposed to traverse a first carrier injection layer 233 and are disposed at the outside of both sides of a receiving groove H in the thickness direction thereof. However, only two insulating patterns 235 are provided to prevent a parasitic channel from being generated at the outside of both sides of the receiving groove H. Meanwhile, the insulating patterns 235 may be larger than the insulating patterns 135 of the first exemplary embodiment. Even in the case that a minimum number of insulating patterns 235 are formed, the semiconductor device 2 allows for an increase in the concentration of carriers at the time of forming a channel, thereby having an increase in current density as compared with a conventional transistor. Also, the insulating patterns 235 are inserted into a high-concentration doping layer such that the generation of a parasitic channel is prevented. Since the generation of the parasitic channel is prevented, current control is facilitated. This allows the semiconductor device 2 having an FET structure to operate at high current and in a normally-off state. Accordingly, a manufacturing process is simplified.

Figure 5:
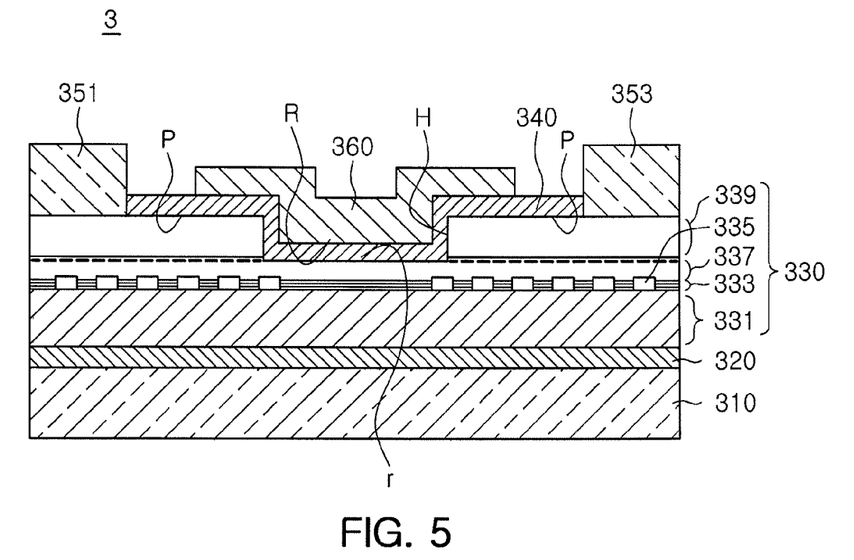
FIG. 5 is a schematic cross-sectional view illustrating a semiconductor device according to a third exemplary embodiment of the present invention.

Referring to FIG. 5, a semiconductor device 3 according to a third exemplary embodiment of the invention has a difference in a material of an upper layer with respect to the semiconductor device 1 according to the first exemplary embodiment. In this regard, a 2-dimensional electron gas (2 DEG) layer (see dotted line of FIG. 5) is formed, instead of including the second carrier injection layer 138 of the first exemplary embodiment.

An upper layer 339 according to the third exemplary embodiment of the invention is formed of an aluminum gallium nitride (AlGaN) layer, rather than an $n^+$ gallium nitride ($n^+$-GaN) layer according to the first exemplary embodiment. Accordingly, the 2 DEG layer is formed at the interface between the upper layer 339 and an intermediate layer 337. Even in the case of including the 2 DEG layer instead of the second carrier injection layer 138 of the first exemplary embodiment, the semiconductor device 3 allows for an increase in the concentration of carriers at the time of forming a channel, thereby having an increase in current density as compared with a conventional transistor. Also, insulating patterns 335 are inserted into a high-concentration doping layer such that the generation of a parasitic channel is prevented. Since the generation of the parasitic channel is prevented, current control is facilitated. This allows the semiconductor device 3 having an FET structure to operate at high current and in a normally-off state. Accordingly, a manufacturing process is simplified.

Figure 6:
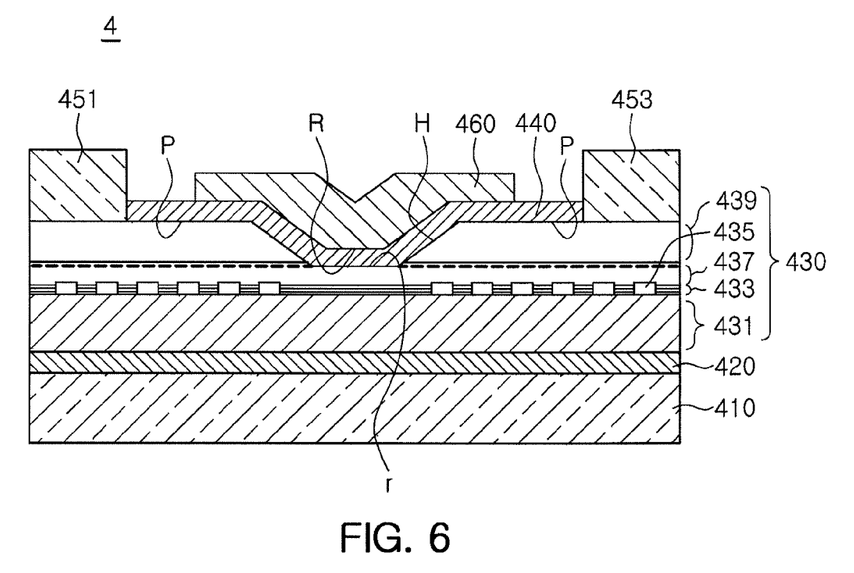
FIG. 6 is a schematic cross-sectional view illustrating a semiconductor device according to a fourth exemplary embodiment of the present invention.

Referring to FIG. 6, a semiconductor device 4 according to a fourth exemplary embodiment of the invention has a difference in a structure of a gate electrode with respect to the semiconductor device 1 according to the first exemplary embodiment.

A gate electrode 460 according to the fourth exemplary embodiment of the invention has a slope at an angle ranging from 30° to 90° so as to relatively reduce electric field concentration at an edge portion of the gate electrode 460, unlike the gate electrode 160 having a vertical structure in the first exemplary embodiment. That is, a receiving groove is formed such that both sides thereof are inclined relative to the lowest portion thereof at an angle ranging from 30° to 90°. As described above, since the gate electrode 460 having the slope has a reduction of electric field concentration at the edge portion thereof, this leads to an advantage of an increase in breakdown voltage. Also, the semiconductor device 4 allows for an increase in the concentration of carriers at the time of forming a channel, thereby having an increase in current density as compared with a conventional transistor. Further, insulating patterns 435 are inserted into a high-concentration doping layer such that the generation of a parasitic channel is prevented. Since the generation of the parasitic channel is prevented, current control is facilitated. This allows the semiconductor device 4 having an FET structure to operate at high current and in a normally-off state.

A method of manufacturing the semiconductor device according to the above-described embodiments of the invention will hereinafter be described with reference to FIGS. 2, 5 and 7A through 8D. Repeated descriptions of the semiconductor device according to the above-described embodiments of the invention will be omitted and simplified.

FIGS. 7A through 7D are schematic cross-sectional views illustrating a method of manufacturing the semiconductor device according to the first exemplary embodiment of the present invention. FIGS. 8A through 8D are schematic cross-sectional views illustrating a method of manufacturing the semiconductor device according to the third exemplary embodiment of the present invention.

Figure 7A:
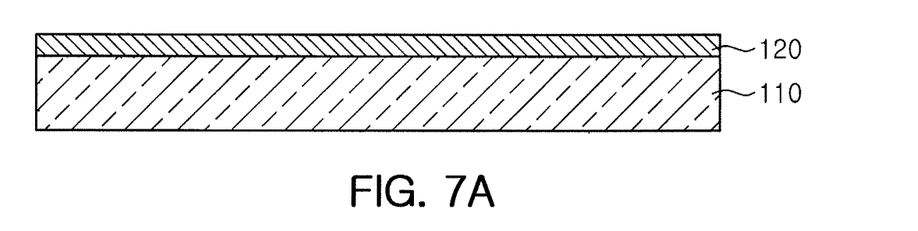
FIGS. 7A through 7D are schematic cross-sectional views illustrating a method of manufacturing the semiconductor device according to the first exemplary embodiment of the present invention.

As shown in FIG. 7A, a base substrate 110 is prepared. As the base substrate 110, a semiconductor substrate may be used. For example, the semiconductor substrate may be at least any one of a silicon substrate, a silicon carbide substrate, and a sapphire substrate. However, the base substrate 110 is not limited thereto.

Subsequently, a buffer layer 120 may be formed on the base substrate 110. Herein, the buffer layer 120 may be formed of an aluminum nitride (AlN) layer; however, the buffer layer 120 is not limited thereto.

The formation of a semiconductor layer 130 according to the first exemplary embodiment of the invention shown in FIG. 2 will be described below.

Figure 7B:
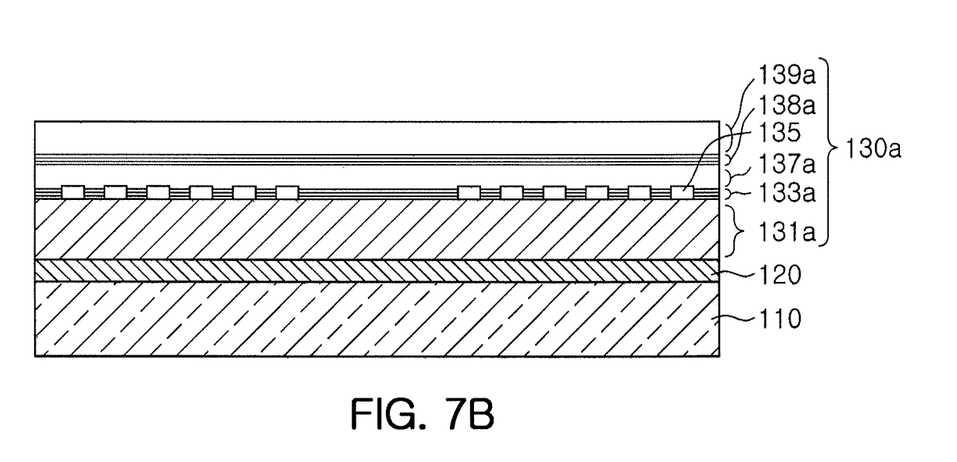

First, as shown in FIG. 7B, a lower layer 131a is epitaxially grown by using the buffer layer 120 as a seed layer. Next, an insulating layer (not shown) that may be formed of $SiO_2$ is formed on the buffer layer 120 and a photoresist pattern (not shown) is formed, and then the insulating layer is etched using the photoresist pattern as an etch mask so that a plurality of insulating patterns 135 are formed. Subsequently, a first carrier injection layer 133a is grown on the insulating patterns 135. Thereafter, an intermediate layer 137a is epitaxially grown on the first carrier injection layer 133a.

The first carrier injection layer 133a may be formed by alternately aligning a multi-layered gallium nitride (GaN) layer and a doping material in a thickness direction. The insulating patterns 135 are provided to traverse the first carrier injection layer 133a. At this time, the first carrier injection layer 133a may be formed by being doped with at least any one selected from Si, Ge, and Sn. Preferably, the first carrier injection layer is doped with Si. However, doping elements of the first carrier injection layer 133a are not limited thereto. Herein, the first carrier injection layer 133a employs a high-concentration doping layer, especially a delta doping layer as an example, but is not limited thereto. The first carrier injection layer 133a may be an n$^+$ doping layer.

In the case of the first carrier injection layer 133a doped with Si as an example, the base substrate 110, formed from the lower layer 131a on which the first carrier injection layer 133a will be formed to the insulating patterns 135, is first disposed inside a reaction tube with a low-pressure hydrogen atmosphere maintained therein and a gallium nitride (GaN) layer is grown, and then the growth of the gallium nitride (GaN) layer is stopped for a predetermined period of time. Thereafter, silane (SiH$_4$) gas is introduced into the reaction tube for a predetermined period of time together with hydrogen gas and ammonium gas to form the first carrier injection layer 133a made of Si on the gallium nitride (GaN) layer and the insulating patterns 135. The first carrier injection layer 133a may have a desired number of layers formed by repeating the above-mentioned process.

At this time, two or more insulating patterns 135 may be formed. The plurality of insulating patterns 135 may be spaced apart from each other by a predetermined interval.

Herein, the lower layer 131a and the intermediate layer 137a may be formed of a high-resistance gallium nitride (GaN) layer.

As an epitaxial growth process for forming the high-resistance gallium nitride (GaN) layer, at least any one of a molecular beam epitaxial growth process, an atomic layer epitaxial growth process, a flow modulation organometallic vapor phase epitaxial growth process, an organometallic vapor phase epitaxial growth process, and a hybrid vapor phase epitaxial growth process may be used. In another example, as a process for forming the gallium nitride (GaN) layer, any one of a chemical vapor deposition process and a physical vapor deposition process may be used.

Next, a second carrier injection layer 138a is grown on the intermediate layer 137a by using the same growth method as that of the first carrier injection layer 133a. Herein, the second carrier injection layer 138a may be formed of a delta doping layer as another high-concentration doping layer.

Thereafter, an upper layer 139a is formed on the second carrier injection layer 138a. Herein, the upper layer 139a may be formed of an n$^+$ gallium nitride (n$^+$-GaN) layer.

Figure 7C:
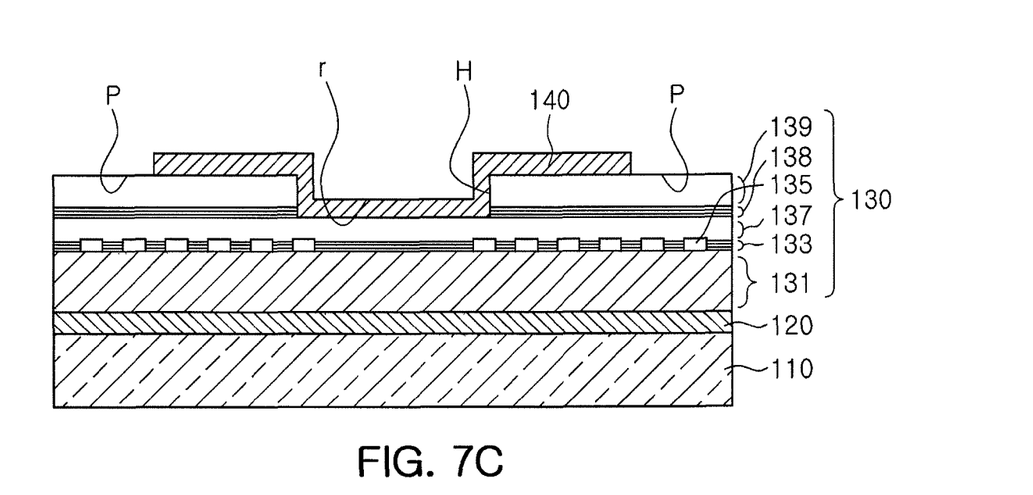

As shown in FIG. 7C, a photoresist pattern (not shown) is formed on the semiconductor layer 130a of the previous process, and the semiconductor layer 130a is then etched through a photoresist process, so that the semiconductor layer 130 including a receiving groove H and a protrusion part P is formed.

Next, an oxide layer 140 may be formed on the semiconductor layer 130. As an example, the oxide layer 140 may be a silicon oxide layer SiO$_2$. A photoresist pattern (not shown) is formed on the oxide layer 140 and is then recessed into the receiving groove H through the photoresist process, so that the oxide layer 140 including a recess structure r is formed. This exemplary embodiment describes, by way of example, the case in which the oxide layer 140 is an oxide layer; however, the oxide layer 140 may include a nitride layer.

The lowest portion of the receiving groove H may contact the uppermost layer of a first carrier injection layer 133 or be disposed above the uppermost layer thereof. Also, the lowest portion of the receiving groove H may contact the lowest layer of a second carrier injection layer 138 or be disposed below the lowest layer thereof.

Also, the insulating pattern 135, disposed at the innermost portion of the semiconductor layer 130, may be disposed to traverse the first carrier injection layer 133 and be disposed at the outside of both sides of the receiving groove H in the thickness direction thereof.

Figure 7D:
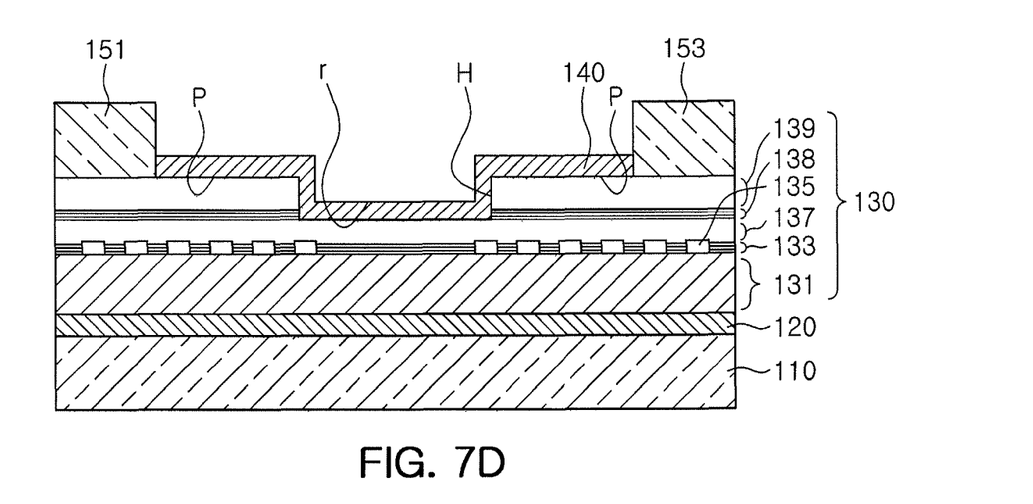

Next, as shown in FIG. 7D, a source electrode 151 and a drain electrode 153 may be formed on the semiconductor layer 130. After a first metal layer (not shown) is formed on the protrusion part P of the semiconductor layer 130, the source electrode 151 and the drain electrode 153, disposed to be spaced apart from each other, may be formed through a predetermined photoresist process. As the first metal layer, a metal layer formed of titanium (Ti), aluminum (Al), nickel (Ni), and gold (Au) from the lower portion thereof may be used.

Then, a gate electrode 160 including a recess part R is formed on the oxide layer 140. After a second metal layer (not shown) formed of a material different from the first metal layer is formed on the oxide layer 140, the gate electrode 160 is formed by performing a predetermined photoresist process. Through the above-described process, the formation of the semiconductor device 1 according to the first exemplary embodiment of the invention shown in FIG. 3 may be completed.

Figure 8A:
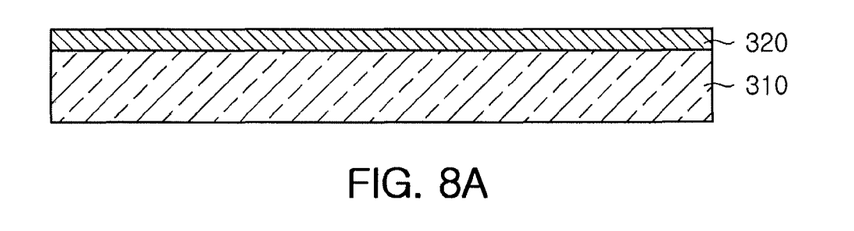
FIGS. 8A through 8D are schematic cross-sectional views illustrating a method of manufacturing the semiconductor device according to the third exemplary embodiment of the present invention.
Figure 8B:
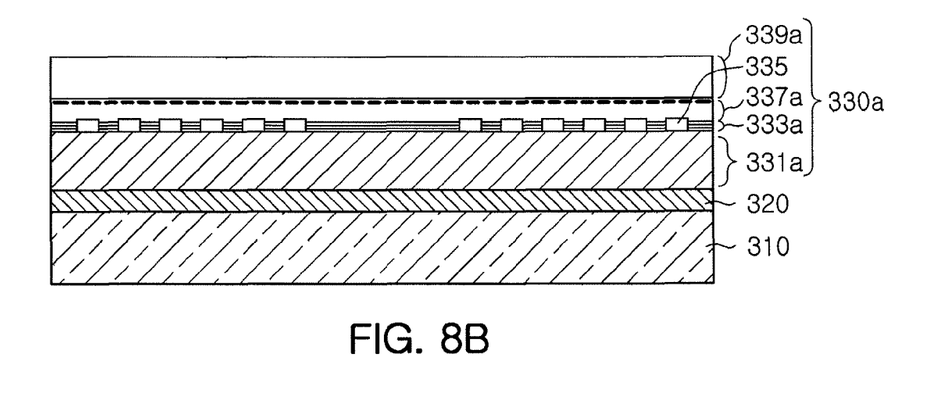
Figure 8C:
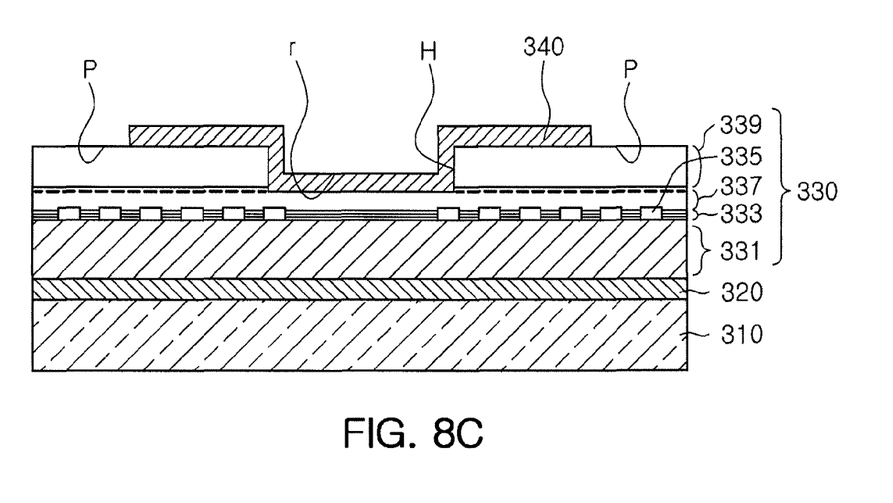
Figure 8D:
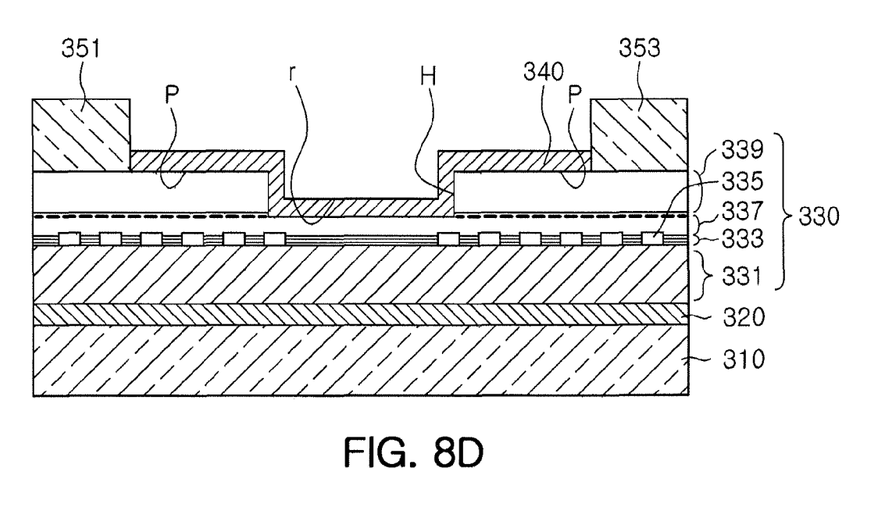

As shown in FIGS. 8A and 8D, a method of manufacturing the semiconductor device according to the third exemplary embodiment of the invention has a difference in a material of an upper layer with respect to the method of manufacturing the semiconductor device according to the first exemplary embodiment. In this regard, a 2 DEG layer (see dotted line) is formed, instead of including the second carrier injection layer 138 of the first exemplary embodiment.

As shown in FIG. 8A, a base substrate 310 is prepared. As the base substrate 310, a semiconductor substrate may be used. For example, the semiconductor substrate may be at least any one of a silicon substrate, a silicon carbide substrate, and a sapphire substrate. However, the base substrate 310 is not limited thereto.

Subsequently, a buffer layer 320 may be formed on the base substrate 310. Herein, the buffer layer 320 may be formed of an aluminum nitride (AlN) layer; however, the buffer layer 320 is not limited thereto. Herein, the buffer layer 320 may be provided to solve the problems caused due to a lattice mismatch between the base substrate 310 and a lower layer 331 of a semiconductor layer 330 to be subsequently formed.

The formation of the semiconductor layer 330 according to the third exemplary embodiment of the invention shown in FIG. 5 will be described below.

First, as shown in FIG. 8B, a lower layer 331a is epitaxially grown by using the buffer layer 320 as a seed layer. Next, an insulating layer (not shown) that may be formed of SiO$_2$ is formed on the buffer layer 320 and a photoresist pattern (not shown) is formed, and then the insulating layer is etched using the photoresist pattern as an etch mask so that a plurality of insulating patterns 335 are formed. Subsequently, a first carrier injection layer 333a is grown on the insulating patterns 335. Thereafter, an intermediate layer 337a is epitaxially grown on the first carrier injection layer 333a.

The first carrier injection layer 333a may be formed by alternately aligning a multi-layered gallium nitride (GaN) layer and a doping material in a thickness direction. The insulating patterns 335 are provided to traverse the first carrier injection layer 333a. At this time, the first carrier injection layer 333a may be formed by being doped with at least any one selected from Si, Ge, and Sn. Preferably, the first carrier injection layer 333a is doped with Si. However, doping elements of the first carrier injection layer 333a are not limited thereto. Herein, the first carrier injection layer 333a employs a high-concentration doping layer, especially a delta doping layer as an example, but is not limited thereto. The first carrier injection layer 333a may be an n+ doping layer.

In the case of the first carrier injection layer 333a doped with Si as an example, the base substrate 310, formed from the lower layer 331a on which the first carrier injection layer 333a will be formed to the insulating patterns 335, is first disposed inside a reaction tube with a low-pressure hydrogen atmosphere maintained therein and a gallium nitride (GaN) layer is grown, and then the growth of the gallium nitride (GaN) layer is stopped for a predetermined period of time. Thereafter, silane ($SiH_4$) gas is introduced into the reaction tube for a predetermined period of time together with hydrogen gas and ammonium gas to form the first carrier injection layer 333a made of Si on the gallium nitride (GaN) layer and the insulating patterns 335. The first carrier injection layer 333a may have a desired number of layers formed by repeating the above-mentioned process.

At this time, two or more insulating patterns 335 may be formed. The plurality of insulating patterns 335 may be spaced apart from each other by a predetermined interval.

Herein, the lower layer 331a and the intermediate layer 337a may be formed of a high-resistance gallium nitride (GaN) layer.

As an epitaxial growth process for forming the high-resistance gallium nitride (GaN) layer, at least any one of a molecular beam epitaxial growth process, an atomic layer epitaxial growth process, a flow modulation organometallic vapor phase epitaxial growth process, an organometallic vapor phase epitaxial growth process, and a hybrid vapor phase epitaxial growth process may be used. In another example, as a process for forming the gallium nitride (GaN) layer, any one of a chemical vapor deposition process and a physical vapor deposition process may be used.

Thereafter, an upper layer 339a is formed on the intermediate layer 337a. Herein, the upper layer 339a may be formed of an aluminum gallium nitride (AlGaN) layer. Accordingly, the 2 DEG layer (see dotted line) is formed at the interface between the upper layer 339a and the intermediate layer 337a.

As shown in FIG. 8C, a photoresist pattern (not shown) is formed on the semiconductor layer 330a of the previous process, and the semiconductor layer 330a is then etched using the photoresist pattern, so that the semiconductor layer 330 including a receiving groove H and a protrusion part P is formed.

Next, an oxide layer 340 may be formed on the semiconductor layer 330. As an example, the oxide layer 340 may be a silicon oxide layer $SiO_2$. A photoresist pattern (not shown) is formed on the oxide layer 340 and is then recessed into the receiving groove H through a photoresist process, so that the oxide layer 340 including a recess structure r is formed. This exemplary embodiment describes, by way of example, the case in which the oxide layer 340 is an oxide layer; however, the oxide layer 340 may include a nitride layer.

The lowest portion of the receiving groove H may contact the uppermost layer of a first carrier injection layer 333 or be disposed above the uppermost layer thereof. Also, the lowest portion of the receiving groove H may contact the lowest layer of the 2 DEG layer or be disposed below the lowest layer thereof.

Also, the insulating pattern 335, disposed at the innermost portion of the semiconductor layer 330, may be disposed to traverse the first carrier injection layer 333 and be disposed at the outside of both sides of the receiving groove H in the thickness direction thereof.

Next, as shown in FIG. 8D, a source electrode 351 and a drain electrode 353 may be formed on the semiconductor layer 330. After a first metal layer (not shown) is formed on the protrusion part P of the semiconductor layer 330, the source electrode 351 and the drain electrode 353, disposed to be spaced apart from each other, may be formed through a predetermined photoresist process. As the first metal layer, a metal layer formed of titanium (Ti), aluminum (Al), nickel (Ni), and gold (Au) from the lower portion thereof may be used.

Thereafter, a gate electrode 360 including a recess part R is formed on the oxide layer 340. After a second metal layer (not shown) formed of a material different from the first metal layer is formed on the oxide layer 340, the gate electrode 360 is formed by performing a predetermined photoresist process. Through the above-described process, the formation of the semiconductor device 3 according to the third exemplary embodiment of the invention shown in FIG. 5 may be completed.

As set forth above, according to exemplary embodiments of the invention, there is provided a semiconductor device having an FET structure allowing for enhanced performance and a method of manufacturing the same.

Also, the semiconductor device having the FET structure includes a carrier injection layer formed of a delta doping layer below a gate electrode, so that it allows for an increase in the concentration of carriers at the time of forming a channel, thereby having an increase in current density as compared with a conventional transistor. Further, insulating patterns are inserted into a high-concentration doping layer such that the generation of a parasitic channel may be prevented. Since the generation of the parasitic channel is prevented, current control is facilitated. This allows the semiconductor device having the FET structure to operate at high current and in a normally-off state.

In addition, the use of a gate electrode having a slope may reduce electric field concentration, and thus an increase in breakdown voltage may be achieved.

The present invention has been described in connection with what is presently considered to be practical exemplary embodiments. Although the exemplary embodiments of the present invention have been described, the present invention may be also used in various other combinations, modifications and environments. In other words, the present invention may be changed or modified within the range of concept of the invention disclosed in the specification, the range equivalent to the disclosure and/or the range of the technology or knowledge in the field to which the present invention pertains. The exemplary embodiments described above have been provided to explain the best state in carrying out the present invention. Therefore, they may be carried out in other states known to the field to which the present invention pertains in using other inventions and also be modified in various forms required in specific application fields and usages of the invention. Therefore, it is to be understood that the invention is not limited to the disclosed exemplary embodiments. It is to be understood that other exemplary embodiments are also included within scope of the appended claims.

What is claimed is:

1. A semiconductor device, comprising:
 a base substrate;
 a semiconductor layer having a receiving groove, a protrusion part, a first carrier injection layer, at least two insulating patterns, and a second carrier injection layer provided on the base substrate, the insulating patterns being disposed to traverse the first carrier injection layer and the second carrier injection layer being spaced apart from the first carrier injection layer and disposed on a lower portion of the protrusion part;

a source electrode and a drain electrode disposed to be spaced apart from each other on the semiconductor layer; and a gate electrode insulated from the source electrode and the drain electrode and having a recess part recessed into the receiving groove, wherein a lowest portion of the receiving groove contacts an uppermost layer of the first carrier injection layer or is disposed above the uppermost layer thereof, and an insulating pattern, disposed at an innermost portion of the semiconductor layer among the insulating patterns, traverses the first carrier injection layer and is disposed at the outside of both sides of the receiving groove in a thickness direction thereof.

2. The semiconductor device of claim 1, wherein the lowest portion of the receiving groove contacts a lowest layer of the second carrier injection layer or is disposed below the lowest layer thereof.

3. The semiconductor device of claim 1, wherein the first carrier injection layer is a high-concentration doping layer.

4. The semiconductor device of claim 3, wherein the high-concentration doping layer is a delta doping layer.

5. The semiconductor device of claim 4, wherein the delta doping layer is provided by being doped with at least any one selected from Si, Ge, and Sn.

6. The semiconductor device of claim 3, wherein the second carrier injection layer is a high-concentration doping layer.

7. The semiconductor device of claim 6, wherein the high-concentration doping layer is a delta doping layer.

8. The semiconductor device of claim 7, wherein the delta doping layer is provided by being doped with at least any one selected from Si, Ge, and Sn.

9. The semiconductor device of claim 3, wherein the second carrier injection layer is a 2-dimensional electron gas layer.

10. The semiconductor device of claim 1, wherein the insulating patterns comprise three or more insulating patterns.

11. The semiconductor device of claim 1, wherein the insulating patterns are spaced apart from each other by a predetermined interval.

12. The semiconductor device of claim 1, wherein the receiving groove has both sides inclined relative to the lowest portion at an angle ranging from 30° to 90°.

13. The semiconductor device of claim 1, further comprising an oxide layer interposed between the receiving groove and the recess part.

14. The semiconductor device of claim 13, wherein the oxide layer has a recess structure corresponding to a shape of the recess part.

15. The semiconductor device of claim 1, further comprising a buffer layer between the base substrate and the semiconductor layer.

16. A method of manufacturing a semiconductor device, the method comprising:

preparing a base substrate;

forming a semiconductor layer having a receiving groove, a protrusion part, a first carrier injection layer, at least two insulating patterns and a second carrier injection layer provided on the base substrate, the insulating patterns being disposed to traverse the first carrier injection layer and the second carrier injection layer being spaced apart from the first carrier injection layer and disposed on a lower portion of the protrusion part;

forming a source electrode and a drain electrode to be spaced apart from each other on the semiconductor layer; and forming a gate electrode on the semiconductor layer, the gate electrode being insulated from the source electrode and the drain electrode and having a recess part recessed into the receiving groove, wherein a lowest portion of the receiving groove contacts an uppermost layer of the first carrier injection layer or is disposed above the uppermost layer thereof, and an insulating pattern, disposed at an innermost portion of the semiconductor layer among the insulating patterns, traverses the first carrier injection layer and is disposed at the outside of both sides of the receiving groove in a thickness direction thereof.

17. The method of claim 16, wherein the lowest portion of the receiving groove contacts a lowest layer of the second carrier injection layer or is disposed below the lowest layer thereof.

18. The method of claim 16, wherein the first carrier injection layer is a high-concentration doping layer.

19. The method of claim 18, wherein the high-concentration doping layer is a delta doping layer.

20. The method of claim 19, wherein the delta doping layer is formed by being doped with at least any one selected from Si, Ge, and Sn.

21. The method of claim 18, wherein the second carrier injection layer is a high-concentration doping layer.

22. The method of claim 21, wherein the high-concentration doping layer is a delta doping layer.

23. The method of claim 22, wherein the delta doping layer is formed by being doped with at least any one selected from Si, Ge, and Sn.

24. The method of claim 18, wherein the second carrier injection layer is a 2-dimensional electron gas layer.

25. The method of claim 16, wherein the insulating patterns comprise three or more insulating patterns.

26. The method of claim 16, wherein the insulating patterns are spaced apart from each other by a predetermined interval.

27. The method of claim 16, wherein the receiving groove is formed such that both sides thereof are inclined relative to the lowest portion at an angle ranging from 30° to 90°.

28. The method of claim 16, further comprising forming an oxide layer to be interposed between the receiving groove and the recess part.

29. The method of claim 28, wherein the oxide layer has a recess structure corresponding to a shape of the recess part.

30. The method of claim 16, further comprising forming a buffer layer on the base substrate prior to the forming of the semiconductor layer.

* * * * *